United States Patent [19]

Iwasaki

[11] Patent Number: 5,355,098
[45] Date of Patent: Oct. 11, 1994

[54] PHASE-LOCKED LOOP WITH MEMORY STORING CONTROL DATA CONTROLLING THE OSCILLATION FREQUENCY

[75] Inventor: Keiichi Iwasaki, Suita, Japan
[73] Assignee: Ricoh Company, Ltd., Tokyo, Japan
[21] Appl. No.: 50,608
[22] Filed: Apr. 22, 1993
[30] Foreign Application Priority Data Apr. 24, 1992 [JP] Japan .................... 4-132036

[51] Int. Cl.$^5$ .................... H03L 1/02; H03L 7/10; H03L 7/18
[52] U.S. Cl. .................... 331/14; 331/16; 331/17; 331/176; 455/260
[58] Field of Search .................... 331/10, 14, 15, 16, 331/17, 25, 1 A, 176; 455/260

[56] References Cited

U.S. PATENT DOCUMENTS 4,906,944  3/1990  Frerking .................... 331/176 X
4,980,652  12/1990  Tarusawa et al. .................... 331/14 X Primary Examiner—David Mis
Attorney, Agent, or Firm—Oblon, Spivak, McClelland, Maier & Neustadt

[57] ABSTRACT

A phase-locked loop with memory storing control data. The control data to be given to a voltage-controlled oscillator in a phase-locked loop is addressed in accordance with an oscillation condition including the frequency of a reference signal, a dividing ratio of the frequency divider and ambient air temperature. When the phase-locked loop is controlled off, the control voltage for the voltage-controlled oscillator is changed into digital data by an analog-to-digital converter to be transferred to the memory. The digital data or control data is read out from the memory when the phase-locked loop is controlled on. The control data is then changed into analog equivalent as control voltage supplied to the voltage-controlled oscillator, shortening the locking-up time.

22 Claims, 13 Drawing Sheets

PHASE-LOCKED LOOP WITH MEMORY STORING CONTROL DATA CONTROLLING THE OSCILLATION FREQUENCY

BACKGROUND OF THE INVENTION

1. Field of the Invention

This invention relates to a phase-locked loop (PLL), and more particularly, to a phase-locked loop with memory storing control data.

2. Description of the Related Art

The phase-locked loop is a closed-loop electronic servomechanism, the output of which locks onto and tracks a reference signal. It also is a communications circuit in which a local oscillator is synchronized in phase and frequency with a received signal.

In the prior art, as shown in FIG. 14, there is known a voltage-controlled oscillator (VCO) 3 (varying the dc voltage varies the frequency of the oscillator), a frequency divider 4 (the output frequency is an integral submultiple of the input frequency), a phase-sensitive detector (PD) 1 (the output is a dc voltage proportional to the phase difference between its two inputs), and a low-pass filter (LPF) 2. It is connected in a loop arrangement so that any phase (frequency) difference between the two inputs of the phase-sensitive detector is minimized. Thus, the VCO output fvco is locked to an integral multiple of the frequency of the reference signal.

Japanese Laid-Open Patent Publication No. 30518/1991, discloses a phase-locked-loop oscillator comprising a voltage-controlled oscillator (VCO), a frequency divider, a phase-sensitive detector, a low-pass filter, an A/D converter and a D/A converter connected in a loop arrangement. The output of the low-pass filter controls the VCO after it is converted into digital equivalents by the A/D converter and again converted into analog equivalents by the D/A converter. If the reference input to the phase-sensitive detector is interrupted, it is sensed by an input signal interruption detector halting the converting operation of the A/D and D/A converters and maintaining the converted digital signal unchanged. Thus, the control signal for the VCO is kept unchanged, maintaining the output frequency constant. However, the phase-locked loop should be controlled even during interruption of the input signal, thus resulting in power consumption. The locking-up time for VCO frequency to lock finally to the frequency of the reference signal also becomes longer when the ambient air temperature changes.

Japanese Laid-Open Patent Publication No. 49422/1991, discloses an oscillator comprising a voltage-controlled oscillator, a temperature sensor, an A/D converter converting the sensor output into a digital equivalent, an EEPROM addressed by the A/D converter output to read out a temperature compensating data and a D/A converter converting the data to analog equivalents for controlling the voltage-controlled oscillator, thus the frequency of the oscillator output is kept constant regardless of variations in the ambient air temperature. When tile temperature compensating data is to be written into EEPROM, the voltage-controlled oscillator, a phase-sensitive detector and a low-pass filter are connected in a loop arrangement. Another A/D converter also converts the low-pass filter output into digital equivalents to be written in the EEPROM as the temperature compensating data. However, the VCO output frequency will not be kept constant when the supply voltage is changed. Besides, alternation of the reference frequency is not easy and the circuit configuration is complicated.

SUMMARY OF THE INVENTION

One object of the invention is to shorten the locking-up time of phase-locked loop when it is controlled on or off, even though a supply voltage and/or ambient air temperature change.

Another object of the invention is to shorten the locking-up time of the phase-locked loop when a reference frequency is changed, even though a supply voltage and/or ambient temperature change.

According to the present invention, the foregoing and other objects are attained by a phase-locked loop with memory storing control data, which is to be given to a voltage-controlled oscillator in a phase-locked loop in accordance with oscillation condition including the frequency of a reference signal, dividing ratio of the frequency divider and ambient temperature, after a digital-to-analog conversion. When the phase-locked loop is to be turned off, the control voltage for the voltage-controlled oscillator is changed into control data by an analog-to-digital converter to be transferred to the memory. The control data written in the memory is read out when the phase-locked loop is turned on. The control data is then changed into analog equivalents as control voltage supplied to the voltage-controlled oscillator, shortening the locking-up time.

Further objects and advantages of the present invention will be apparent from the following description of the preferred embodiments of the invention as illustrated in the accompanying drawings.

DESCRIPTION OF THE PREFERRED EMBODIMENTS

Figure 1:
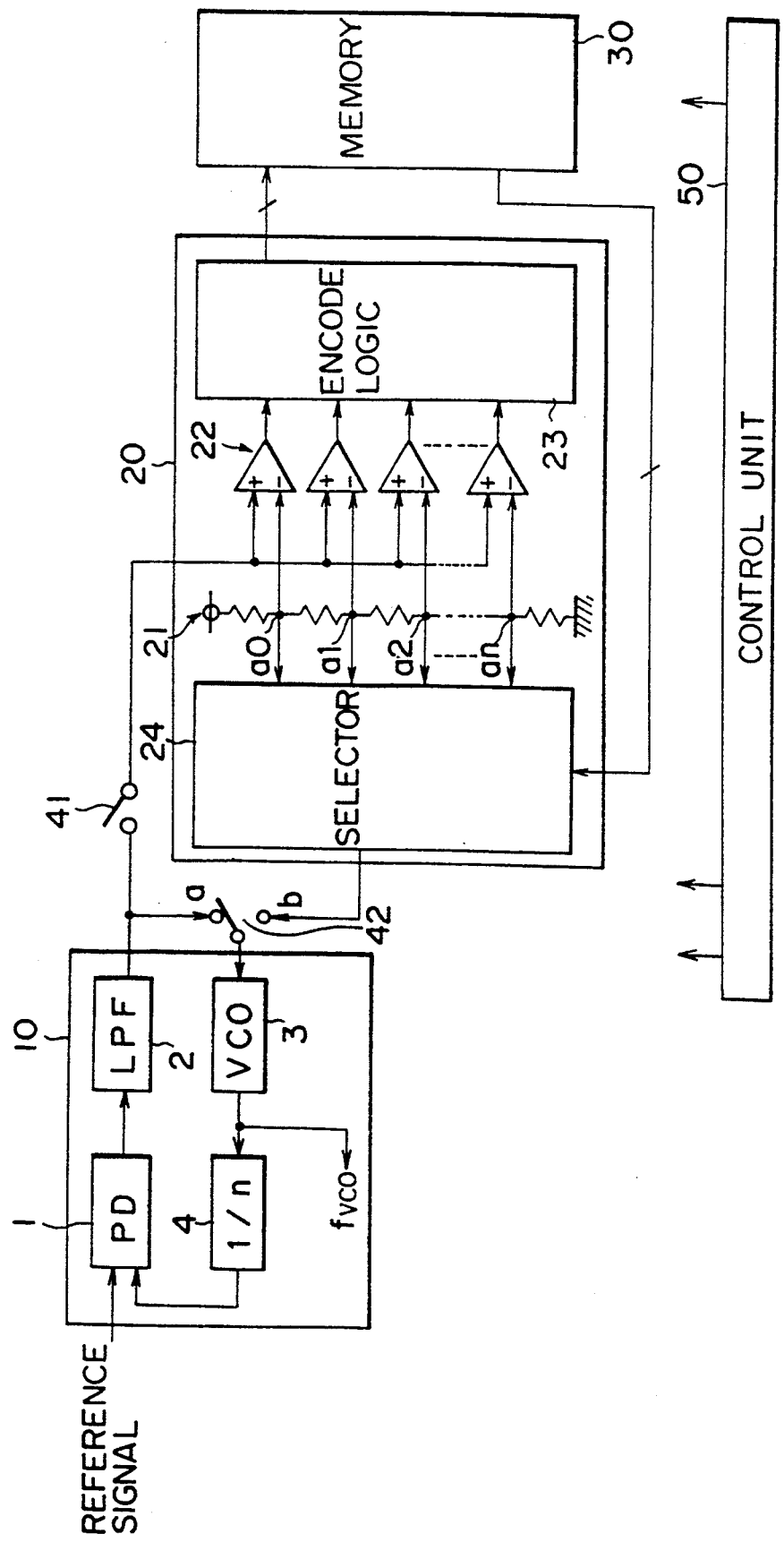
FIG. 1 is a block diagram of a phase-locked loop with a memory for storing control data in accordance with a first embodiment of the invention.

Referring now to FIG. 1 illustrating a first embodiment of the invention, the phase-locked loop 10 comprises a voltage-controlled oscillator (VCO) 3. The voltage-controlled oscillator 3 generates a rectangular wave or sine wave signal at a frequency varied by a control voltage. The frequency divider 4 delivers an output signal, which frequency is an integral submultiple (1/n) of the oscillation frequency of the voltage-controlled oscillator 3, as a phase-comparison signal. A phase-sensitive detector 1 provides an output signal which is proportional to the phase difference between a reference signal and the phase-comparison signal. A low-pass filter 2 receives the output signal of phase-sensitive detector 1 and passes the control voltage for the voltage-controlled oscillator 3.

In FIG. 1, there is also shown a flash analog-to-digital converter 20, a memory 80, a single-pole single-throw switch 41, a single-pole double-throw switch 42 and a control unit 50. The switches may be electronic ones. The control unit 50 controls the operation of phase-locked loop 10, switches 41 and 42, analog-to-digital converter 20 and memory 30. The control unit 50 is arranged to have a CPU (Central Processing Unit), a ROM (Read Only Memory), a RAM (Random Access Memory) and an interface. The CPU serves to carry out the control operations on the basis of a program stored in the ROM. A register, a static random-access memory (SRAM), a dynamic random-access memory (DRAM), an electrically erasable programmable read-only memory (EEPROM), etc. may be used for the memory 30. A volatile memory is preferably backed up by a battery.

The flash analog-to-digital converter 20 changes the control voltage for the voltage-controlled oscillator 3 to digital equivalents. It comprises a reference voltage source 21, comparators 22 and an encode logic 23. The reference voltage source 21 is a precision resistor divider having output terminals or resistor taps a0, a1, a2, . . . , an for individual reference voltages. The comparator 22 comprises a string of individual comparators. A selector 24 is also provided. Each of the resistor taps a0, a1, a2, . . . , an of the reference voltage source 21 is connected to an input terminal of each of the individual comparators to perform an anolog-to-digital conversion of the control voltage for the voltage-controlled oscillator 3. The output signal of each individual comparator indicates whether or not the input signal of the VCO3 is greater or less than the voltage established by the resistor tap, and the encoder logic 23 generates the digital data output. A flash analog-to-digital conversion is described in, for example, J. J. Brophy, Basic Electronics for Scientists, Fifth Edition, McGraw-Hill, New York, 1990, pages 358–360. The digital data corresponding to the control voltage after the analog-to-digital conversion has been performed is stored in the memory 30.

The reference voltage source 21 together with the selector 24 also constitute a digital-to-analog converter. The resistor taps a0, a1, a2, . . . , an of the reference voltage source 21 are also connected to the selector 24 to supply an analog output in a digital-to-analog conversion. The selector 24 is controlled to select one of the output voltages supplied at resistor taps a0, a1, a2, . . . , an of the reference voltage source 21 in response to a digital code or control data read out from the memory 30. A digital-to-analog converter using a resistor divider is described in D. G. Fink and D. Christiansen, Electronics Engineers' Handbook, Third Edition, McGraw-Hill, New York, 1989, pages 8-74–8-76.

Figure 2:
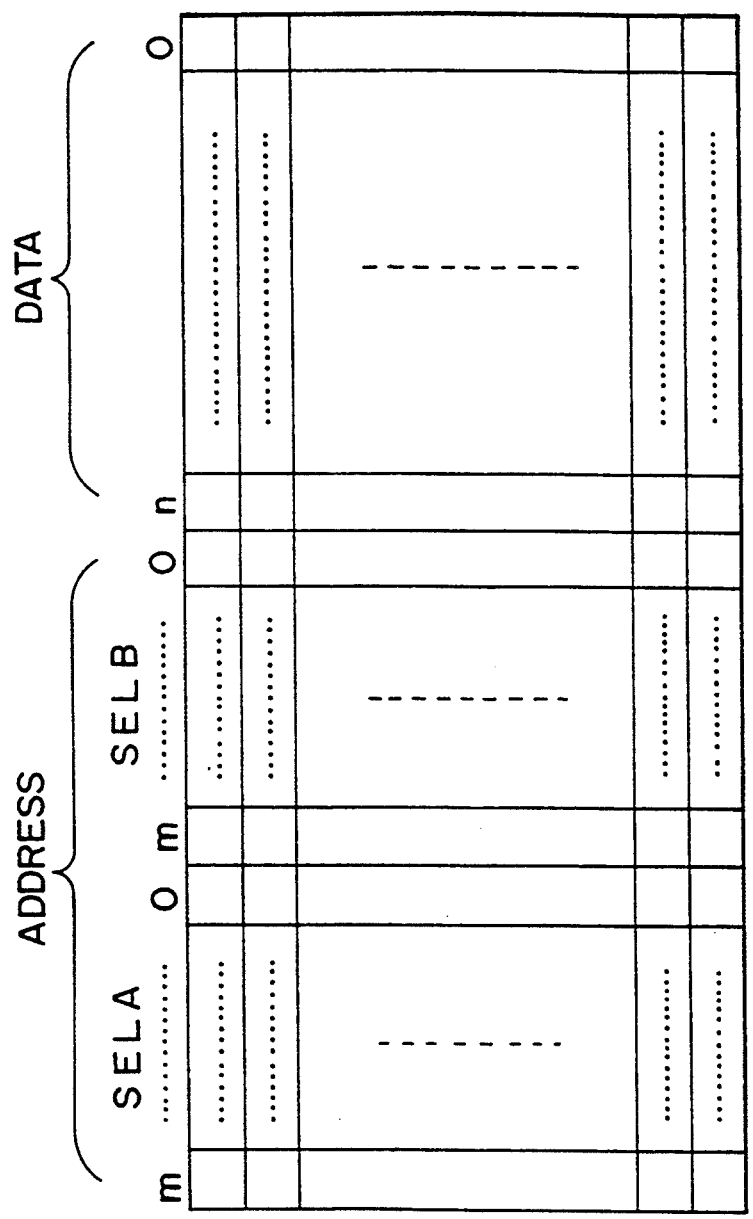
FIG. 2 is a table showing the organization of the memory shown in FIG. 1.

Referring to FIG. 2, there is shown an organization of the memory 30 shown in FIG. 1. An address word is shown, which addresses a location at which the converted data is to be stored in the memory 30, consisting of SELA and SELB fields. The SELA field contains the highest (m+1) bits m, . . . , 0, and is used to indicate the type, more specifically the frequency, of a reference signal. The SELB field contains the lowest (m+1) bits m, . . . , 0, and is used to indicate the dividing ratio or fraction of frequency divider 4. In other words, an address of the location in which the digital data corresponding to the control voltage is to be stored in the memory 30 is specified according to the oscillation condition of the phase-locked loop 10.

Figure 3:
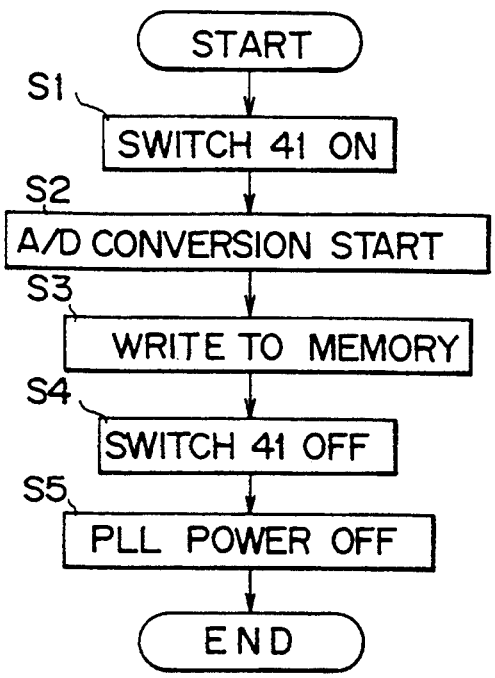
FIGS. 3 and 4 are flow charts illustrating respectively a write operation and a read operation of the phase-locked loop with memory storing control data shown in FIG. 1.
Figure 4:
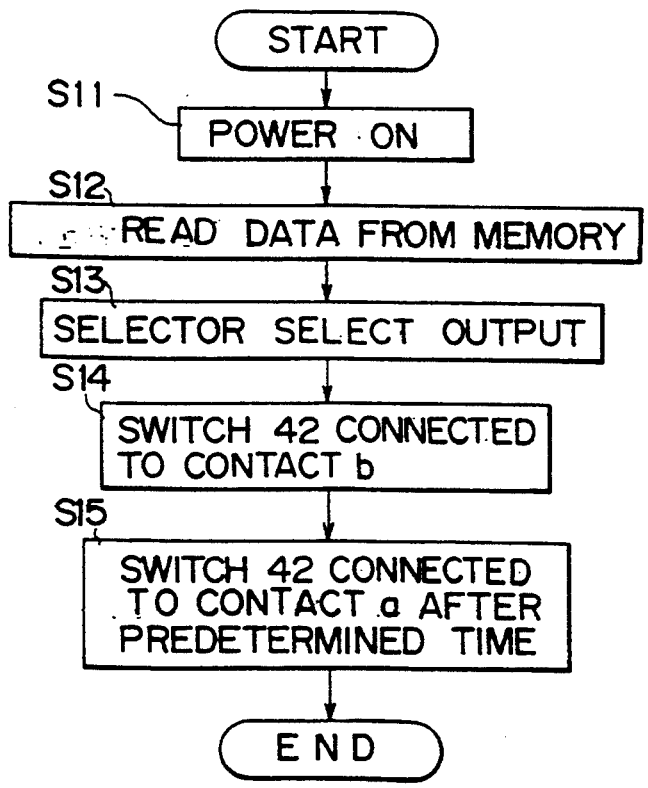

Referring now to FIGS. 3 and 4, there are shown a write operation and a read operation by means of the control unit 50, respectively. In a normal operation, the switch 41 is turned off and a moving contact of switch 42 is connected to a stationary contact a in its first position as shown in FIG. 1. Thus, the phase-locked loop 10 connected in a loop arrangement outputs a rectangular wave signal fvco on a predetermined oscillation condition.

In the write operation, first of all, the switch 41 is turned on (step S1), and the process of analog-to-digital conversion starts to convert the control voltage for the voltage-controlled oscillator 3 (step S2). The control data, after the conversion has been performed, is written into the memory 30 (step S3). Then, the switch 41 is turned off (step S4). Power supply (not shown) is disconnected from the phase-locked loop 10, that is, it is controlled off.

Now, the read operation will be explained. When the phase-locked loop 10 is controlled on (step S11), control data is read out from the memory 30 (step S12) and sent to the selector 24. Therefore, control voltage corresponding to the control data is output from the selector 24 (step S13). Now, the moving contact of switch 42 is connected to a stationary contact b (step S14) in its second position, and the control voltage is delivered to the input of the voltage-controlled oscillator 3. After a predetermined time, the moving contact of switch 42 is connected back to the stationary contact a (step S15).

Figure 5A:
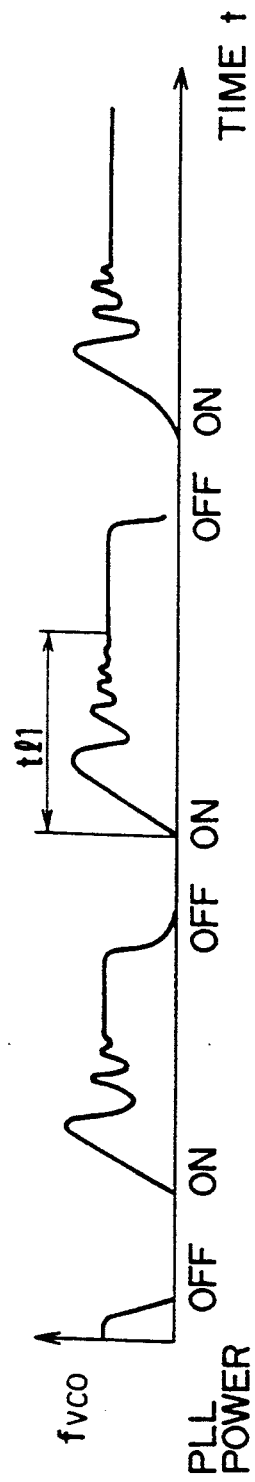
FIG. 5a illustrates oscillation frequency and time characteristic of the phase-locked loop shown in FIG. 14, when it is controlled on or off.
Figure 5B:
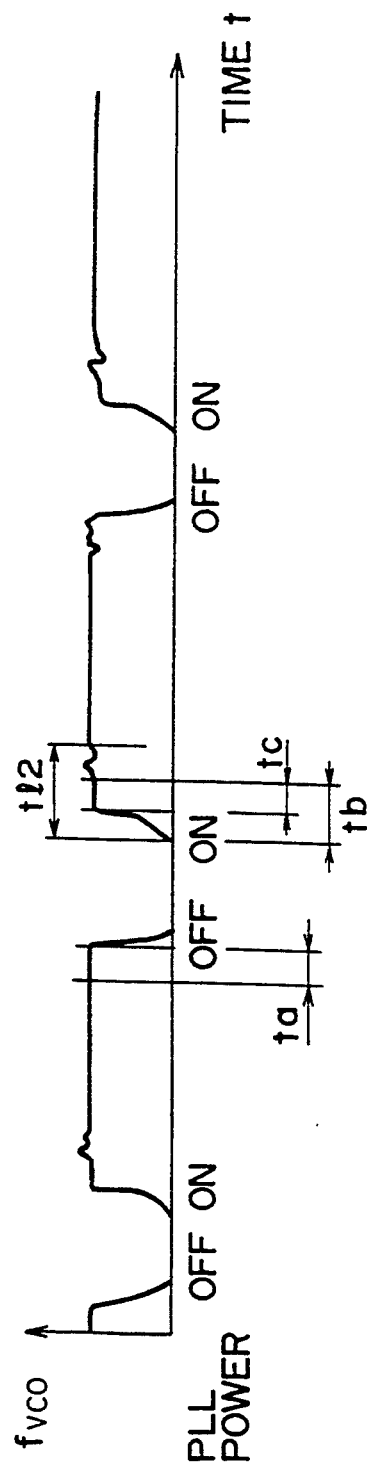
FIG. 5b illustrates oscillation frequency and time characteristic of the phase-locked loop with memory storing control data shown in FIG. 1, when it is controlled on or off.
Figure 14:
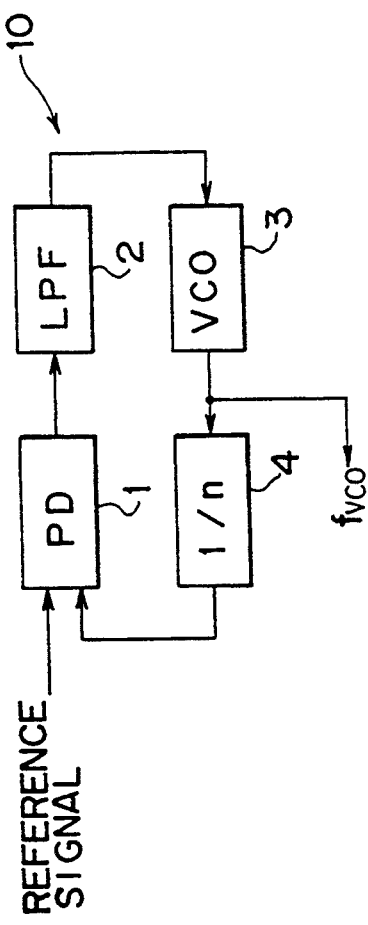
FIG. 14 is a block diagram of a phase-locked loop in accordance with the prior art.

FIG. 5a shows oscillation frequency fvco and time t characteristic of the phase-locked loop 10 shown in FIG. 14, when it is controlled on or off. FIG. 5b shows oscillation frequency and time characteristic of the phase-locked loop 10 with memory 30 storing control data shown in FIG. 1, when the phase-locked loop 10 is controlled on or off. In FIGS. 5a and 5b, t11 and t12 denote the locking-up time of the phase-locked loops, respectively. Besides, ta, tb and tc in FIG. 5b respectively denote the write operation time, the read operation time and the time during which the moving contact of switch 42 is connected to the stationary contact b. It is understood that the locking-up time t12 according to the invention is much shorter than the locking-up time t11 according to the prior art. If the voltage output from the digital-to-analog converter during tc is quite the same as the target of the control voltage for the voltage-controlled oscillator 3, then the locking-up time t12 is approximately equal to t12 =tb−tc.

Figure 6A:
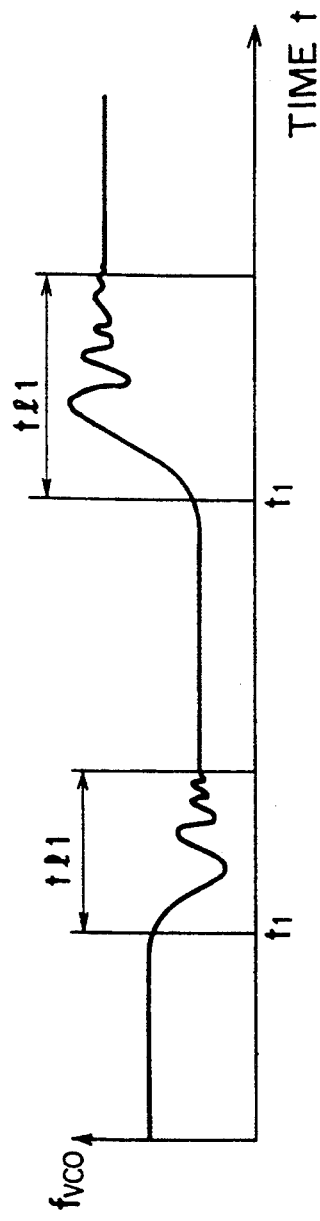
FIG. 6a illustrates oscillation frequency and time characteristic of the phase-locked loop shown in FIG. 14, when the oscillation frequency is changed intentionally.
Figure 6B:
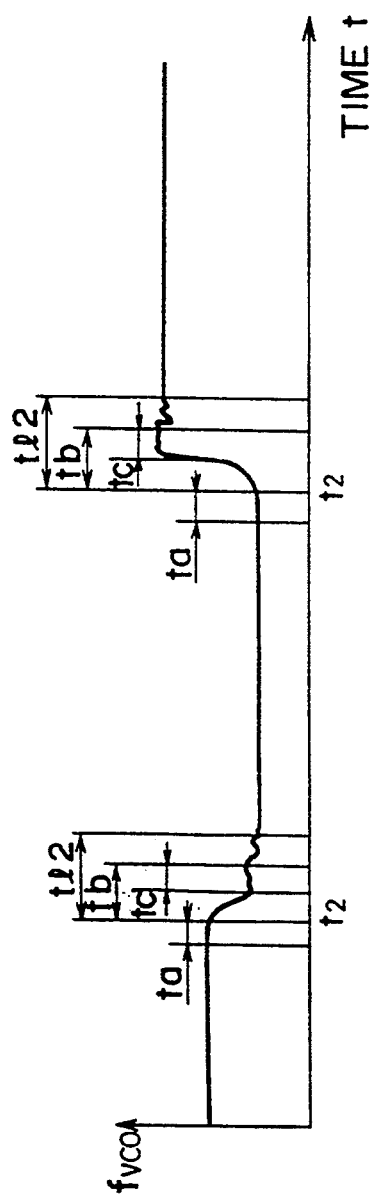
FIG. 6b illustrates oscillation frequency and time characteristic of the phase-locked loop with memory storing control data shown in FIG. 1, when the oscillation frequency is changed intentionally.

FIG. 6a shows oscillation and time characteristic of the phase-locked loop 10 shown in FIG. 14, when it is controlled to change the oscillation frequency. FIG. 6b shows oscillation frequency and time characteristic of the phase-locked loop 10 with memory 30 storing control data shown in FIG. 1, when it is controlled to change the oscillation frequency. The oscillation frequency of the phase-locked loop could be changed by the alternation of the frequency of the reference signal or dividing ratio of the frequency divider. In FIGS. 6a and 6b, t1 and t2 denote the time when the phase-locked loops are set to change oscillation frequency, respectively. And, t11 and t12 denote the locking-up time of the phase-locked loops, respectively. Besides, ta, tb and tc in FIG. 6b respectively denote the write operation time, the read operation time and the time during which the moving contact of the switch 42 is connected to the stationary contact b. It is also understood that the locking-up time t12 according to the present invention is much shorter than the one according to the prior art.

Figure 7:
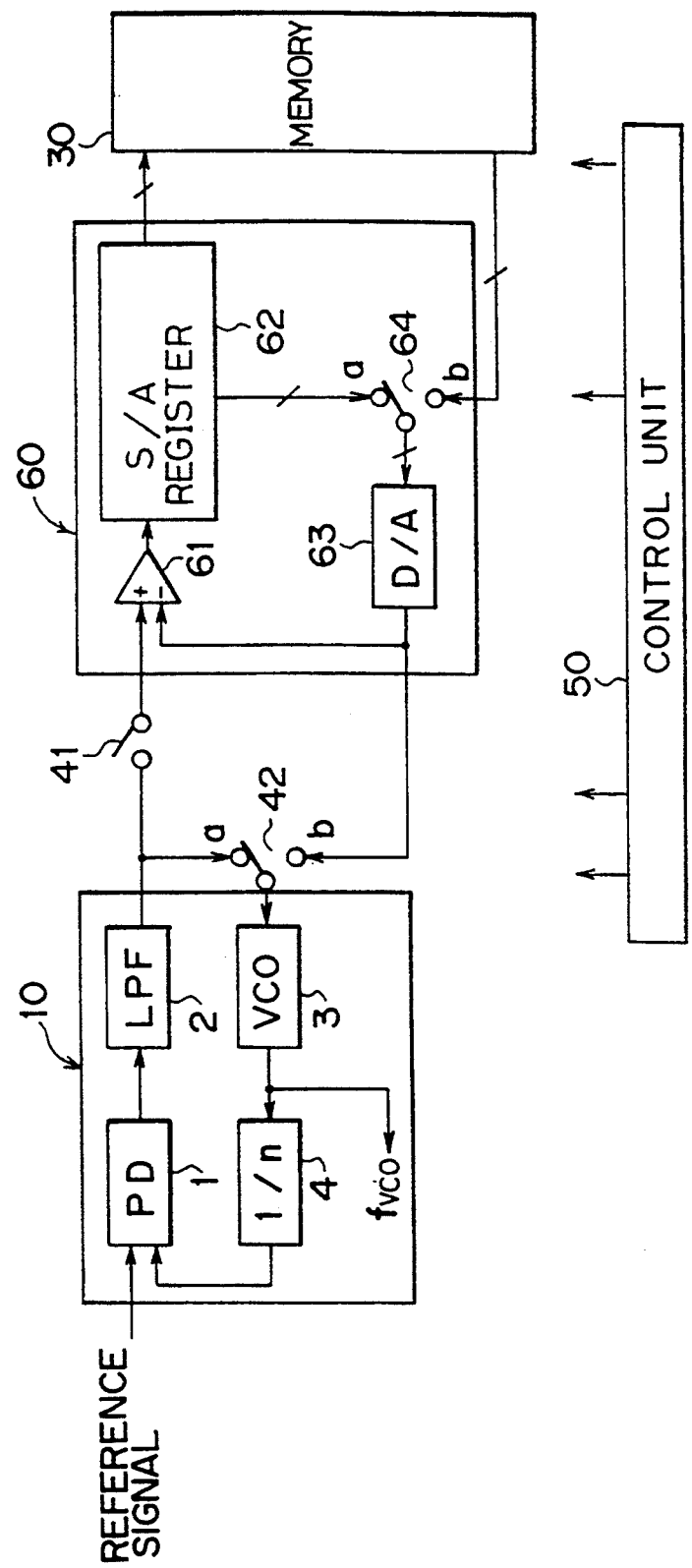
FIG. 7 is a block diagram of a phase-locked loop with memory storing control data in accordance with a second embodiment of the invention.

Referring now to FIG. 7, there is shown a second embodiment of the invention. The phase-locked loop (PLL) 10 comprises a voltage-control led oscillator (VCO) 3, a frequency divider 4, a phase-sensitive detector (PD) 1 and a low-pass filter (LPF) 2.

In FIG. 7, there is also shown a successive-approximation analog-to-digital converter 60, a memory 30, a single-pole single-throw switch 41, a single-pole double-throw switch 42 and a control unit 50. The successive-approximation analog-to-digital converter 60 comprises a comparator 61, a successive approximation (S/A) register 62 and a digital-to-analog (D/A) converter 63. A successive-approximation analog-to-digital conversion is described in, for example, J. J. Brophy, Basic Electronics for Scientists, Fifth Edition, McGraw-Hill, New York, 1990, pages 356–358. A single-pole double-throw switch 64 is also provided. Data from the successive approximation register 62 or the memory 30 is selected to be input to the digital-to-analog converter 83 by the switch 84. The control data after the analog-to-digital converter 80 has performed analog-to-digital conversion is stored in the memory 30. The control unit 50 controls switch 84 as well as switches 41 and 42.

Figure 8:
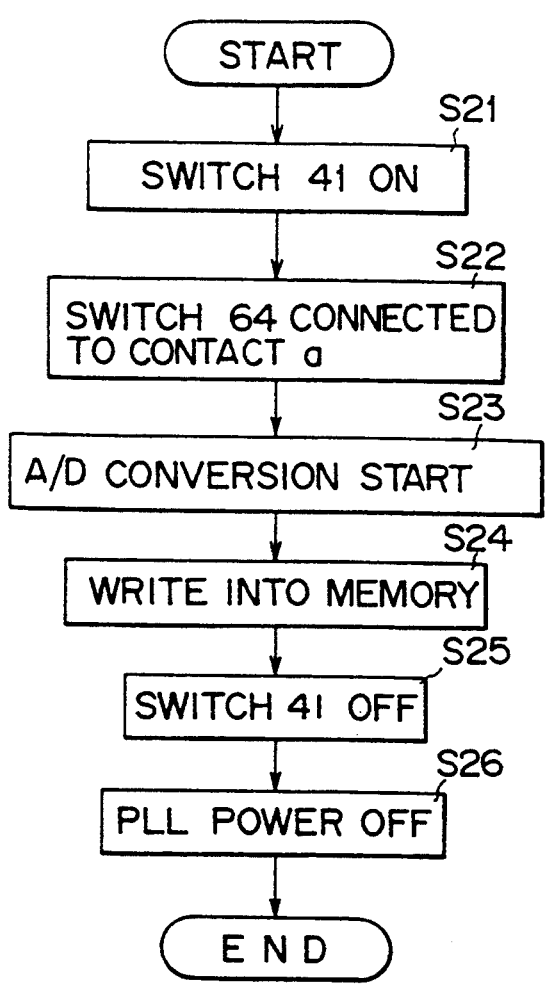
FIGS. 8 and 9 are flow charts illustrating respectively a write operation and a read operation of the phase-locked loop with memory storing control data shown in FIG. 7.
Figure 9:
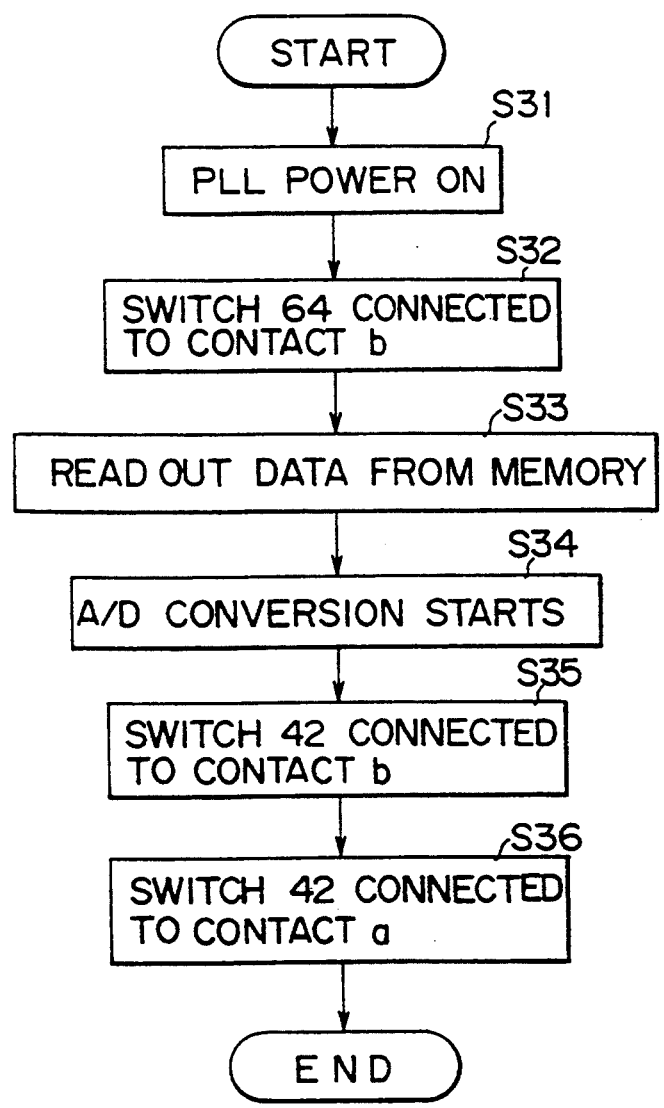

Referring now to FIGS. 8 and 9, there are shown respectively a write operation and a read operation of the circuit shown in FIG. 7. In a normal operation, a moving contact of switch 42 is connected to a stationary contact a. Thus, the phase-locked loop 10 connected in a loop arrangement outputs a rectangular wave signal fvco on a predetermined oscillation condition.

In the write operation, first of all, the switch 41 is turned on (step S21). The moving contact of switch 42 is maintained in contact with the stationary contact a. A moving contact of switch 64 is connected to a stationary contact a (step S22). The process of analog-to-digital conversion starts (step S23). That is, the control voltage for the voltage-controlled oscillator 3 is converted into digital equivalents by the analog-to-digital conversion. After the analog-to-digital conversion has been performed, the digital data is written into the memory 30 (step S24). The switch 41 is turned off (step S25), and the phase-locked loop 10 is controlled off (step S26).

The read operation will be explained. The phase-locked loop 10 is controlled on (step S31), and the moving contact of switch 64 is connected to a stationary contact b (step S32). Then, the control data is read out from the memory 30 (step S33), and fed to the digital-to-analog converter 63. Therefore, the control data read from the memory is converted into analog equivalents by means of the digital-to-analog converter 63 (step S34). Then, the moving contact of switch 42 is connected to a stationary contact b (step S35). The control voltage obtained by the digital-to-analog conversion is fed to the input of the voltage-controlled oscillator 3. After a predetermined time, the moving contact of switch 42 is connected back to the stationary contact a (step S36).

When the phase-locked loop with memory storing control data shown in FIG. 7 is controlled on or off, or the oscillation frequency is changed intentionally, its oscillation frequency and time characteristic are quite similar to the case of the phase-locked loop shown in FIG. 1. Therefore, the characteristics could be shown by the same curve as shown in FIGS. 5b and 6b.

Figure 10:
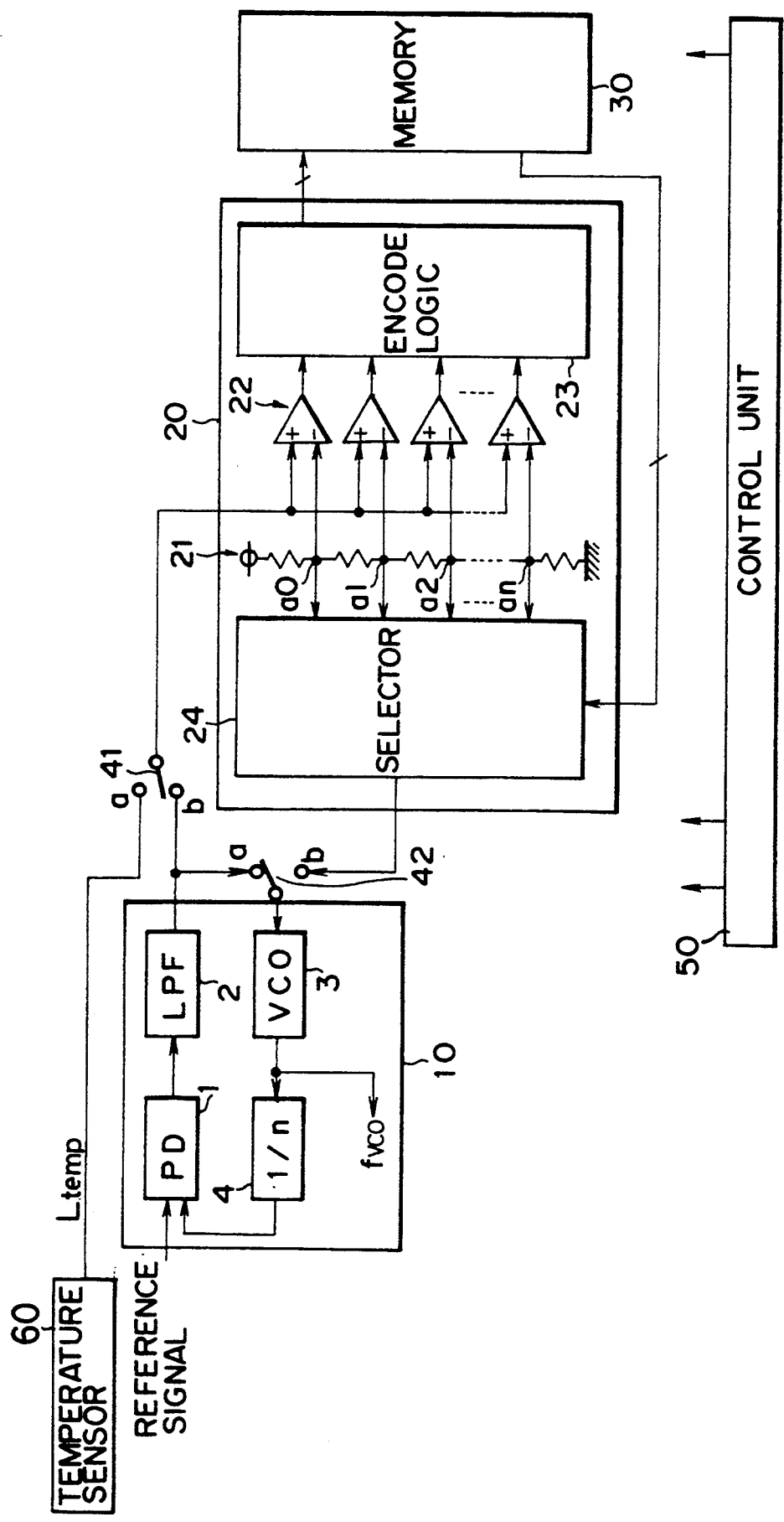
FIG. 10 is a block diagram of a phase-locked loop with memory storing control data in accordance with a third embodiment of the invention.

Referring now to FIG. 10, there is shown a third embodiment of the invention. The phase-locked loop (PLL) 10 comprises a voltage-controlled oscillator (VCO) 3, a frequency divider 4, a phase-sensitive detector (PD) 1 and a low-pass filter (LPF) 2.

In FIG. 10, there is also shown a flash analog-to-digital converter 20, a memory 30, and single-pole and double-throw switches 41 and 42. Besides, there is provided a temperature sensor 60. The analog-to-digital converter 20 converts not only the control voltage for the voltage-control oscillator but also the temperature detection signal Ltemp from the sensor 60 into digital equivalents.

Figure 11:
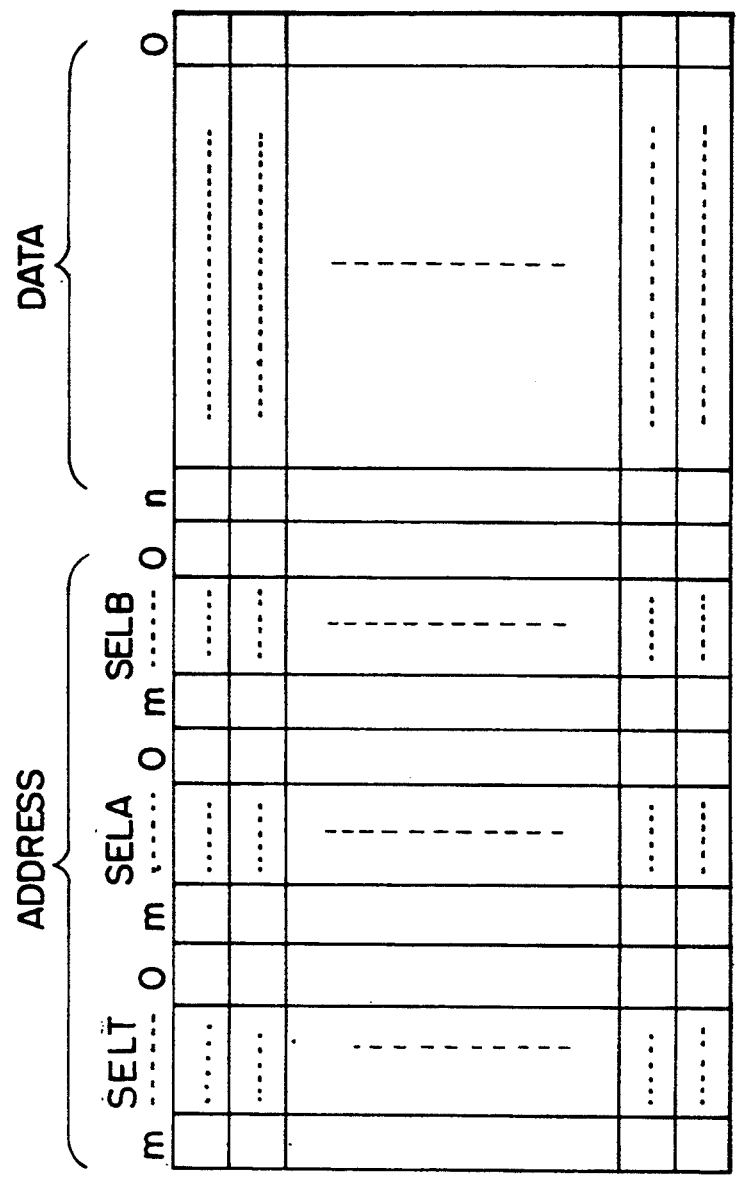
FIG. 11 is a table showing the organization of the memory shown in FIG. 10.

Referring to FIG. 11, there is shown an organization of the memory 30 shown in FIG. 10. An address word, which addresses a location the converted data is to be stored in the memory 30, consisting of SELT, SELA and SELB fields. The SELT field contains the highest (m+1) bits m, . . . , 0 and is used to indicate the digital equivalent of the temperature detection signal after an analog-to-digital conversion. The SELA field contains the middle (m+1) bits m, . . . , 0, and is used to indicate the type of a reference signal. The SELB field contains the lowest (m+1) bits m, . . . , 0, and is used to indicate a dividing ratio of the frequency divider 4. The SELT field does not need to contain all the bits of the digital equivalents of the temperature detection signal. The number of bits allocated to the SELT field in an address word could be determined according to the memory capacity. As for the control voltage of the voltage-controlled oscillator, however, all the bits of the data after analog-to-digital conversion has been performed are utilized to be written into the memory.

Figure 12:
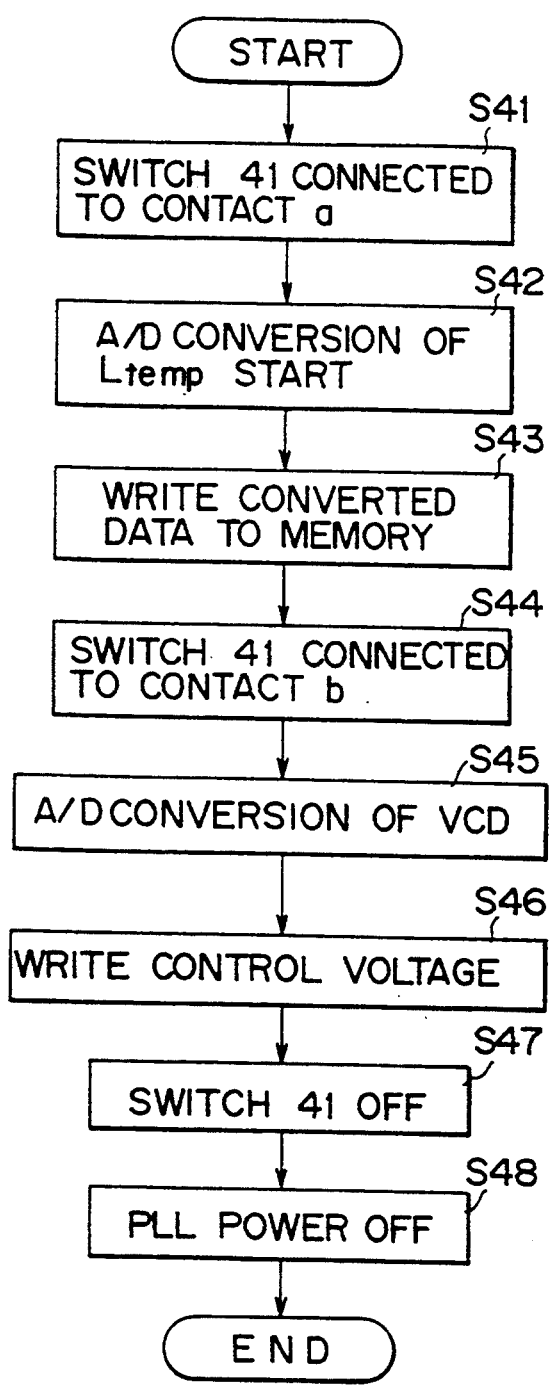
FIGS. 12 and 13 are flow charts showing respectively a write operation and a read operation of the phase-locked loop with memory storing control data shown in FIG. 10.
Figure 13:
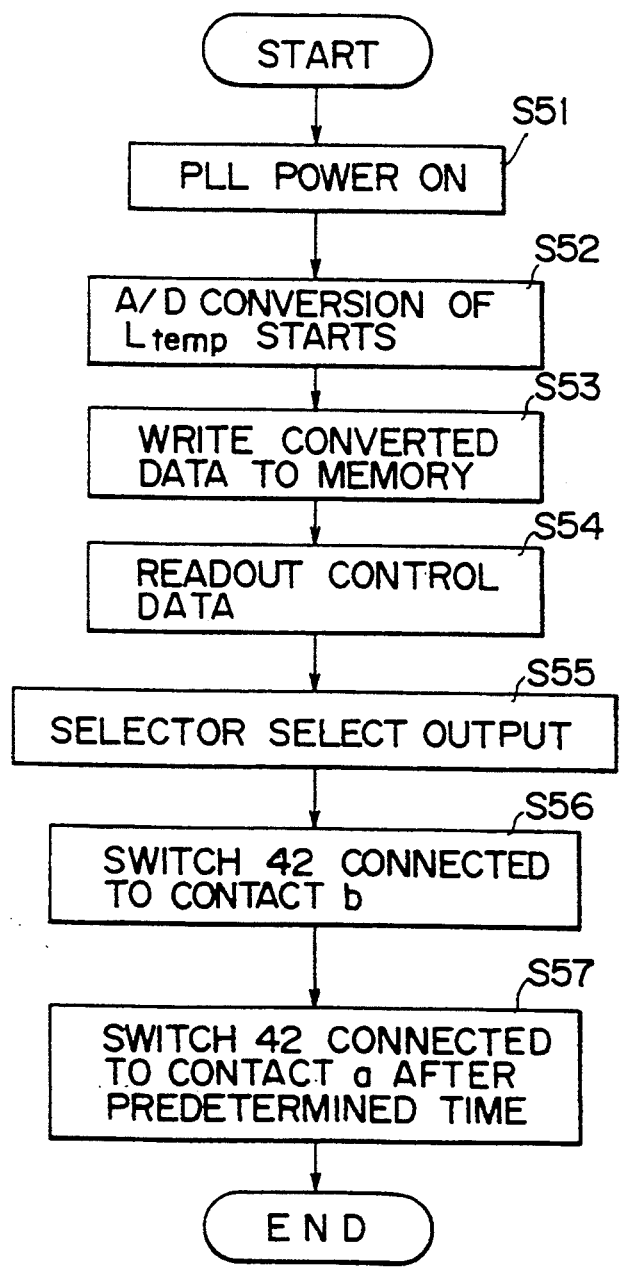

Referring now to FIGS. 12 and 13, there are shown respectively a write operation and a read operation of the circuit shown in FIG. 10. Moving contacts of switches 41 and 42 are respectively connected to stationary contacts a as shown in FIG. 10. Thus, the phase-locked loop 10 connected in a loop arrangement outputs a rectangular wave signal fvco on a predetermined oscillation condition.

In the write operation, first of all, the moving contact of switch 41 is maintained in contact with the stationary contact a (step S41), and the process of an analog-todigital conversion of the temperature detection signal Ltemp starts by means of the analog-to-digital converter 20 (step S42). Then, the converted data of the temperature detection signal Ltemp is transferred to the memory 30 to be stored temporarily (step S43). After that, the moving contact of switch is connected to a stationary contact b (step S44), and the process of analog-to-digital conversion of the control voltage for the voltage-controlled oscillator 3 starts by means of converter 20 (step S45). Then, the control data obtained by the analog-to-digital conversion of control voltage is written into a location in the memory, the address is determined by the data in the step S43 as well as the oscillating condition. Now, the moving contact of switch 41 is connected to the stationary contact a (step S47), and the phase-lock loop is controlled off.

The read operation will be explained. When the phase-locked loop is controlled on (step S51), the moving contact of switch 41 is connected to the terminal a. The process of analog-to-digital conversion of temperature detection signal starts by means of the analog-to-digital converter 20 (step S52). Then, the converted data of the temperature detection signal Ltemp is transferred to the memory 30 to be stored temporarily (step S53). The digital equivalent of the control voltage is read out from the memory 30, the location or address is determined by the data in the step S53 as well as the oscillation condition, and transferred to the selector 24 (step S54). Therefore, the voltage equivalent for the readout control data is output from the selector 24 (step S55). Then, the moving contact of switch 42 is connected to the stationary contact b (step S56), and the output from the selector 24 is fed to the input of the voltage-controlled oscillator 3 as the control data. After a predetermined time, the moving contact of switch 42 is connected back to the stationary contact a (step S57).

When the phase-locked loop with memory to store control data shown in FIG. 10 is controlled on or off, or its oscillation frequency is changed intentionally, the oscillation frequency and time characteristic are quite similar to the case of the phase-locked loop shown in FIG. 1. Therefore, they could be shown by the same curve as shown in FIGS. 5b and 6b.

Many widely different embodiment of the present invention may be constructed without departing from the spirit and scope of the present invention. It should be understood that the present invention is not limited to the specific embodiments described in the specification except as defined in the appended claims.

What is claimed is:

1. A phase-locked loop, comprising:
   a voltage-controlled oscillator;
   a phase detector having inputs connected to an output of the voltage-controlled oscillator and an external reference signal source, respectively;
   a low-pass filter having an input connected to an output of the phase detector;
   an electronic switch connecting an output of the low-pass filter to the oscillator input when the switch is in a first position;
   the voltage-controlled oscillator, the phase detector and the low-pass filter thereby forming said loop when the switch is in said first position;
   an analog-to-digital converter having an input connected to an output of the low-pass filter for receiving analog signals output by said low-pass filter and for outputting digital signals corresponding to said received analog signals;
   a memory connected to an output of the analog-to-digital converter for storing digital data corresponding to said digital signals output by said analog-to-digital converter;
   a digital-to-analog converter, connected to the memory through which control data corresponding to said stored digital data is read out from said memory;
   the electronic switch connecting an output of the digital-to-analog converter to the input of the voltage-controlled oscillator when the switch is in a second position;
   a control unit controlling an operation of said loop; and
   the analog-to-digital converter comprising a reference voltage source, a comparator for comparing a plurality of individual reference voltages with the input of the voltage-controlled oscillator, an encode logic providing an appropriate digital output in accordance with an output of the comparator, and the digital-to-analog converter comprising a reference voltage source and a selector to output an individual reference voltage as analog equivalents of the control data, and the reference voltage source in the analog-to-digital converter being also used for the reference voltage source in the digital-to-analog converter.

2. A phase-locked loop as in claim 1, further comprising a frequency changer having an input and an output connected to the oscillator output and the phase detector input, respectively.

3. A phase-locked loop as in claim 2, wherein the frequency changer is a frequency divider.

4. A phase-locked loop as in claim 2, wherein the frequency changer is a frequency multiplier.

5. A phase-locked loop as in claim 1, wherein the reference signal is a constant frequency signal or a modulated wave signal.

6. A phase-locked loop, comprising:
   a voltage-controlled oscillator;
   a phase detector having inputs connected to an output of the voltage-controlled oscillator and an external reference signal source, respectively;
   a low-pass filter having an input connected to an output of the phase detector;
   an electronic switch connecting an output of the low-pass filter to the oscillator input when the switch is in a first position;
   the voltage-controlled oscillator, the phase detector and the low-pass filter thereby forming said loop when the switch is in said first position;
   an analog-to-digital converter having an input connected to an output of the low-pass filter for receiving analog signals output by said low-pass filter, and for outputting digital signals corresponding to said received analog signals;
   a memory connected to an output of the analog-to-digital converter for storing digital data corresponding to said digital signals output by said analog-to-digital converter;
   a digital-to-analog converter, connected to the memory through which control data corresponding to said stored digital data is read out from said memory;
   the electronic switch connecting an output of the digital-to-analog converter to the input of the voltage-controlled oscillator when the switch is in a second position;

a control unit controlling an operation of said loop; and the analog-to-digital converter comprising a comparator comparing successively a sequence of voltages having a weighted code with the input of the voltage-controlled oscillator, a successive-approximation register having an input connected to the comparator for providing an appropriate digital output and a digital-to-analog converter for converting the digital output of the successive-approximation register into analog equivalents supplied to the comparator, and the digital-to-analog converter being also used to output analog equivalents of control data.

7. A phase-locked loop as in claim 6, further comprising a frequency changer having an input and an output connected to the oscillator output and the phase detector input, respectively.

8. A phase-locked loop as in claim 7, wherein the frequency changer is a frequency divider.

9. A phase-locked loop as in claim 7, wherein the frequency changer is a frequency multiplier.

10. A phase-locked loop as in claim 6, wherein the reference signal is a constant frequency signal or a modulated wave signal.

11. A phase-locked loop, comprising:
a voltage-controlled oscillator having an input for receiving a signal for varying the oscillation frequency;
a phase detector having inputs connected to an output of the voltage-controlled oscillator and an external reference signal source, respectively;
a low-pass filter having an input connected to an output of the phase detector;
a first electronic switch connecting an output of the low-pass filter to the oscillator input when the switch is in a first position;
the voltage-controlled oscillator, the phase detector and the low-pass filter thereby forming said loop when the switch is in said first position;
an analog-to-digital converter having an input connected to an output of the low-pass filter through a second electronic switch in its first position for receiving analog signals output by said low-pass filter and for outputting digital signals corresponding to said received analog signals;
a memory connected to an output of the analog-to-digital converter for storing digital data corresponding to said digital signals output by said analog-to-digital converter;
a digital-to-analog converter, connected to the memory, through which control data corresponding to said stored digital data is read out from said memory;
the first electronic switch connecting an output of the digital-to-analog converter to the input of the oscillator when the switch is in a second position;
a temperature sensor having an output connected to the input of the analog-to-digital converter through the second electronic switch in its second position; and
a control unit for controlling an operation of said loop.

12. A phase-locked loop as in claim 11, further comprising a frequency changer having an input and an output connected to the oscillator output and the phase detector input, respectively.

13. A phase-locked loop as in claim 12, wherein the frequency changer is a frequency divider.

14. A phase-locked loop as in claim 12, wherein the frequency changer is a frequency multiplier.

15. A phase-locked loop as in claim 11, wherein the reference signal is a constant frequency signal or a modulated wave signal.

16. A phase-locked loop, comprising:
a voltage-controlled oscillator having an input for receiving a signal for varying the oscillation frequency;
a phase detector having inputs connected to an output of the oscillator and an external reference signal source, respectively;
a low-pass filter having an input connected to an output of the phase detector;
a first electronic switch connecting an output of the low-pass filter to the oscillator input when the switch is in a first position;
the voltage-controlled oscillator, the phase detector and the low-pass filter thereby forming said loop when the switch is in said first position;
an analog-to-digital converter having an input connected to an output of the low-pass filter through a second electronic switch in its first position for receiving analog signals output by said low-pass filter for outputting digital signals corresponding to said received analog signals;
a memory connected to an output of the analog-to-digital converter for storing digital data corresponding to said digital signals output by said analog-to-digital converter;
a digital-to-analog converter, connected to the memory, through which control data corresponding to said stored digital data is read out from said memory;
the first electronic switch connecting an output of the digital-to-analog converter to the input of the oscillator when the switch is in a second position;
a temperature sensor having an output connected to the input of the analog-to-digital converter through the second electronic switch in its second position;
a control unit controlling an operation of said loop; and
at least one component of the analog-to-digital converter constitutes a component of the digital-to-analog converter.

17. A phase-locked loop as in claim 16, further comprising a frequency changer having an input and an output connected to the oscillator output and the phase detector input, respectively.

18. A phase-locked loop as in claim 17, wherein the frequency changer is a frequency divider.

19. A phase-locked loop as in claim 17, wherein the frequency changer is a frequency multiplier.

20. A phase-locked loop as in claim 16, wherein the reference signal is a constant frequency signal or a modulated wave signal.

21. A phase-locked loop as in any one of claims 16–20, wherein the analog-to-digital converter comprises a reference voltage source, a comparator to compare the individual reference voltage with the input signal, an encode logic providing an appropriate digital output in accordance with the comparator output, the digital-to-analog converter comprises a reference voltage source and a selector to output an individual reference voltage as analog equivalents of the control data, and the reference voltage source in the analog-to-digital converter is also used for the reference voltage source in the digital-to-analog converter.

22. A phase-locked loop as in any one of claims 16–20, wherein the analog-to-digital converter comprises a comparator comparing successively a sequence of voltages having a weighted code with the input of the voltage-controlled oscillator, a successive-approximation register having an input connected to the comparator providing an appropriate digital output and a digital-to-analog converter to convert the digital output of the successive-approximation register into analog equivalents supplied to the comparator, and the digital-to-analog converter is also used to output analog equivalents of control data.

* * * * *